United States Patent [19]
Guido

[11] Patent Number: 5,614,734
[45] Date of Patent: Mar. 25, 1997

[54] HIGH EFFICENCY LED STRUCTURE

[75] Inventor: Louis J. Guido, Trumbull, Conn.

[73] Assignee: Yale University, New Haven, Conn.

[21] Appl. No.: 404,592

[22] Filed: Mar. 15, 1995

[51] Int. Cl.$^6$ ........................................... H01L 33/00
[52] U.S. Cl. .............................. 257/94; 257/95
[58] Field of Search ........................ 257/94, 95

[56] References Cited

U.S. PATENT DOCUMENTS

| | | | |
|---|---|---|---|
| 4,378,255 | 3/1983 | Holonyak, Jr. et al. | 148/1.5 |
| 4,439,782 | 3/1984 | Holonyak, Jr. | 357/17 |
| 4,511,408 | 4/1985 | Holonyak, Jr. | 148/1.5 |
| 4,594,603 | 6/1986 | Holonyak, Jr. | 357/16 |
| 4,639,275 | 1/1987 | Holonyak, Jr. | 148/1.5 |
| 5,048,035 | 9/1991 | Sugawara et al. | 372/45 |

OTHER PUBLICATIONS

Beggy, "Visible Surface–Emitting Semiconductor Devices," Dissertation, Yale University (1993).

Colvin, et al., "Light-emmitting Diodes Made from Cadmium Selenide Nanocrystals and a Semiconducting Polymer," *Nature*, 370:354–356 (1994).

Cook, et al., "High Efficiency 650nm Aluminum Arsenide Light Emitting Diodes," *Inst. Phys. Conf.* Ser. No. 91:Chapter 7, 777–780 (1988).

Cunningham, et al., "Annealed Indium Oxide Transparent Ohmic Contacts to GaAs," *J. Appl. Phys.* 71:1070–1072 (1992).

(List continued on next page.)

*Primary Examiner*—Stephen Meier
*Attorney, Agent, or Firm*—Fish & Richardson, P.C.

[57] ABSTRACT

An LED structure including a distributed Bragg reflector having multiple periods, each period including at least a first layer made of a first indirect band gap material and a second layer made of a second indirect band gap material, the first band gap material having a higher index of refraction than the second indirect band gap material; and a light emitting diode formed on top of the distributed Bragg reflector, the light emitting diode having a top layer and a bottom layer, the bottom layer being proximate to the distributed Bragg reflector.

24 Claims, 4 Drawing Sheets

OTHER PUBLICATIONS

Golan, et al., "Novel Indium Oxid/n–GaAs Diodes," *Appl. Phys. Lett.* 57:2205–2207 (1990).

Huang, et al., "Twofold Efficiency Improvement in High Performance AlGaInP Light–Emitting Diodes in the 555–620 nm Spectral Region Using a Thick Gap Window Layer," *Appl. Phys. Lett.* 61:1045–1047 (1992).

Ishikawa, et al., "New Double–Heterostructure Indium–Tin Oxide/InGaAsP/AlGaAs Surface Light–Emitting Diodes at 650–nm Range," *J. Appl. phys.* 65:2181–2185 (1989).

Kaplan, et al., "Bright Prospects for Brighter LEDs," *Photonics Spectra,* 65–66 (1991).

Kato, et al., "GaAs/GalAs Surface Emitting IR LED with Bragg Reflector Grown by MOCVD," *Journal of Crystal Growth,* 107:832–835 (1991).

Kish, et al., "Very High–Efficiency Semiconductro Wafer–Bonded Transparent–Substarte $(Al_xGa_{1-x})_{0.5}In_{0.5}P$/GaP Light–Emitting Diodes," *Appl. Phys. Lett.* 64:2839–2841 (1994).

Lawrence, et al., "$GaAs_{0.6}P_{0.4}$LED'with Efficient Transparent Contacts for Spatially uniform Light Emission," *IEEE,* 580–585 (1983).

Lott, et al., "Visible (660nm) Resonant Cavity Light–Emitting Diodes," *Electronics Letters,* 29:328–329 (1993).

Pan, et al., "High–Quality Transparent Conductive Indium Oxide Films Prepared by Thermal Evaooration," *Appl. Phys. Lett.,* 37:163–165 (1980).

Schnitzer, et al., "30% External Quantrum Efficiency from Surface Textured, Thin–Film light–Emitting Diodes," *Appl. Phys. Lett.,* 63:2174–2176 (1993).

Schnitzer, et al., "Ultrahigh Spontaneous Emission Quantum Efficiency, 99.7% Internally and 72% Externally from AlGaAs/GaAs/AlGaAs Double Heterostructures," *Appl. Phys. Lett.,* 62:131–133 (1993).

Schubert, et al., "Highly efficient Light–Emitting Diodes with Microcavities," *Science,* 265:943–945 (1994).

Sugawara, et al., "High–Efficiency InGaALP/GaAs Visible Light–Emitting Diodes," *Appl. Phys. Lett.,* 58:1010–1012 (1991).

Sugawara, et al., "High–Brightness InGaAlp Green Light–Emitting Diodes," *Appl. Phys. Lett.,* 61:1775–1777 (1992).

Yoffe, "Rectification in Heavily Doped P–type GaAs/AlAs Heterojunctions," *J. Appl. Phys.,* 70:1081–1083 (1991).

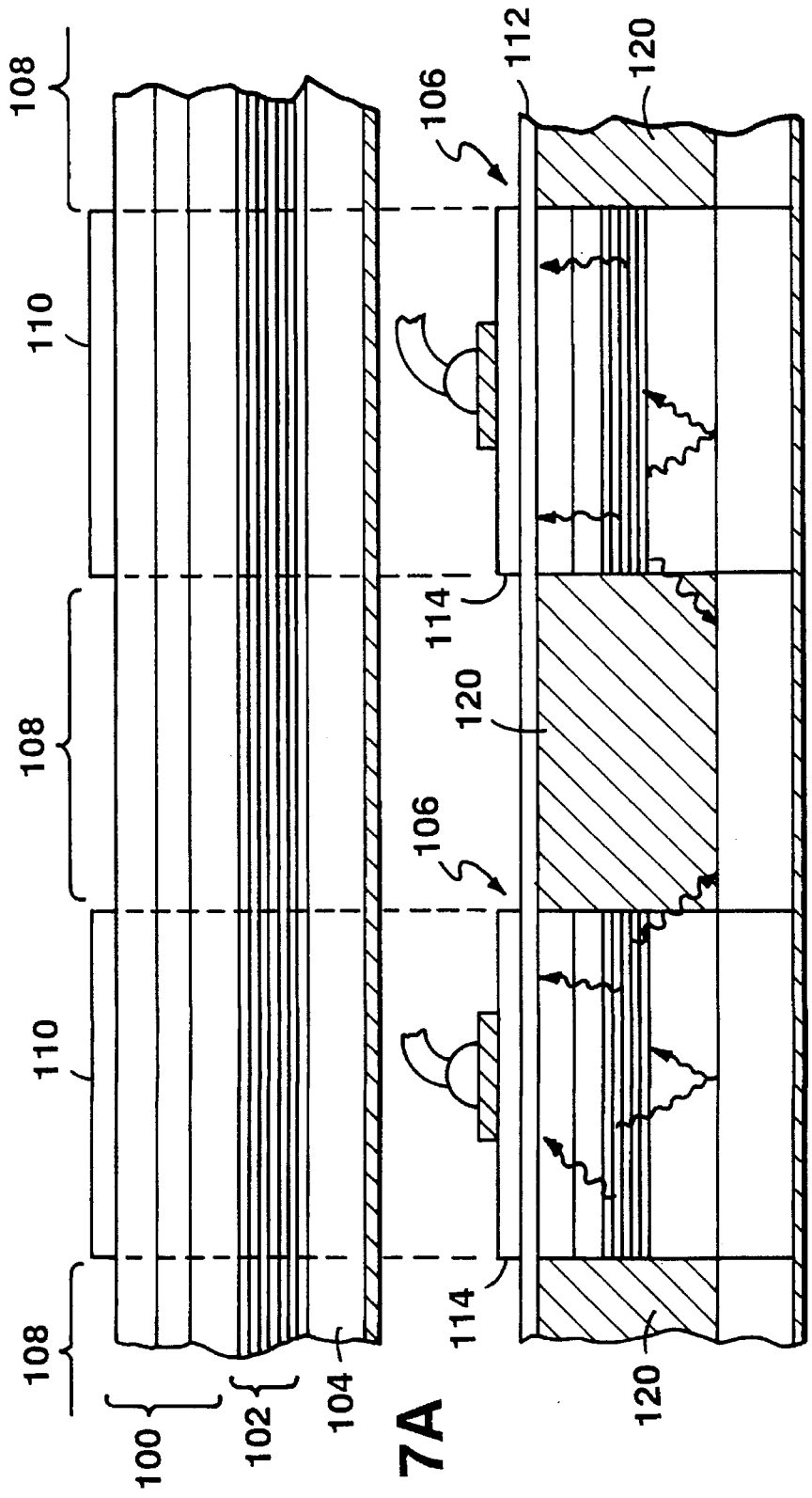

HIGH EFFICENCY LED STRUCTURE

BACKGROUND OF THE INVENTION

The invention relates to light emitting diodes (i.e., LED's) and to techniques for producing integrated LED structures.

Light emitting diodes (or LED's) are devices which convert electrical energy into optical radiation. In general, these devices operate by injecting minority carriers into an active region of a semiconductor device. The active region may be the junction region of a p-n diode or it may be the i-type region of a p-i-n double heterostructure junction. When a forward bias is placed across the device, the p-type side of the junction injects holes into the active region and the n-type side of the junction injects electrons into the active region. Within the active region, the injected minority carriers (i.e., the injected holes and electrons) recombine through various mechanisms. Some of the recombinations occur through radiative transitions, others occur through nonradiative transitions. If the material that is used to form the p-n junction is an efficient luminescent material, the radiative transitions will predominate over the nonradiative transitions.

It is desirable in designing and fabricating LED's to minimize the loss mechanisms within the device which interfere with the electrical power being converted into useable light that is emitted from the device. It is also desirable to have a fabrication technique which lends itself to building integrated LED arrays on a single substrate or wafer.

SUMMARY OF THE INVENTION

The general, in one aspect, the invention is an $Al_xGa_{l-x}As$ p-n junction light emitting diode, with a thin $In_2O_3$ current spreading layer, on the top-side, and an indirect band-gap $AlAs-Al_{0.6}Ga_{0.4}As$ distributed Bragg reflector, on the bottom-side. This structure yields a significant increase in electrical-to-optical power conversion efficiency, and a significant reduction in active region heating—in comparison with standard devices prepared and tested as controls.

In general, in another aspect, the invention is an LED structure including a distributed Bragg reflector and a light emitting diode formed on top of the distributed Bragg reflector. The distributed Bragg reflector has multiple periods, each period including a first layer made of a first indirect band gap material and a second layer made of a second indirect band gap material. The first band gap material has a higher index of refraction than the second indirect band gap material. The light emitting diode has a top layer and a bottom layer, the bottom layer being proximate to the distributed Bragg reflector.

In general, in still another aspect, the invention is an LED structure including a light emitting diode having a top layer and a bottom layer and a light emitting region; an $In_2O_3$ current spreading layer formed on top of the top layer of the light emitting diode; and a metal contact pad formed on top of a portion of the $In_2O_3$ current spreading layer above the active region leaving an unobstructed portion of the $In_2O_3$ current spreading layer through which light generated in the light emitting active region passes out of the LED structure. The unobstructed portion has an area that is at least as large as 50% of the area of the light emitting region.

In general, in yet another aspect, the invention is a method of fabricating an integrated LED structure which includes a plurality of light emitting pixel elements. The method includes the steps of forming over a top surface of a substrate a distributed Bragg reflector; fabricating a light emitting diode above the distributed Bragg reflector; and in regions between the pixel elements, introducing a disordering element into the integrated LED structure to convert the distributed Bragg reflector beneath those regions into a disordered material and to thereby degrade reflectivity of the distributed Bragg reflector within those regions.

The invention achieves a dramatic improvement in electrical-to-optical power conversion efficiency ($\eta_p$) at an emission wavelength of $\lambda \sim 675$ nm. In addition, the $In_2O_3$ current spreading layer greatly reduces junction heating, thereby minimizing peak wavelength red-shift and line width broadening under normal operating conditions.

With the invention it becomes easier to fabricate integrated structures with many LED's on a single wafer. Pixels of desired shape can be achieved by appropriately patterning the $In_2O_3$ current spreading layer; and inter pixel isolation is achieved by using impurity-induced layer disordering to eliminate the DBR in the regions between pixels, thereby increasing contrast separation between pixels.

Other advantages and features will become apparent from the following description of the preferred embodiment and from the claims.

BRIEF DESCRIPTION OF THE DRAWINGS

FIG. 7A and 7B is a section view of an integrated structure with multiple LED's.

DESCRIPTION OF THE PREFERRED EMBODIMENTS

Figure 1:
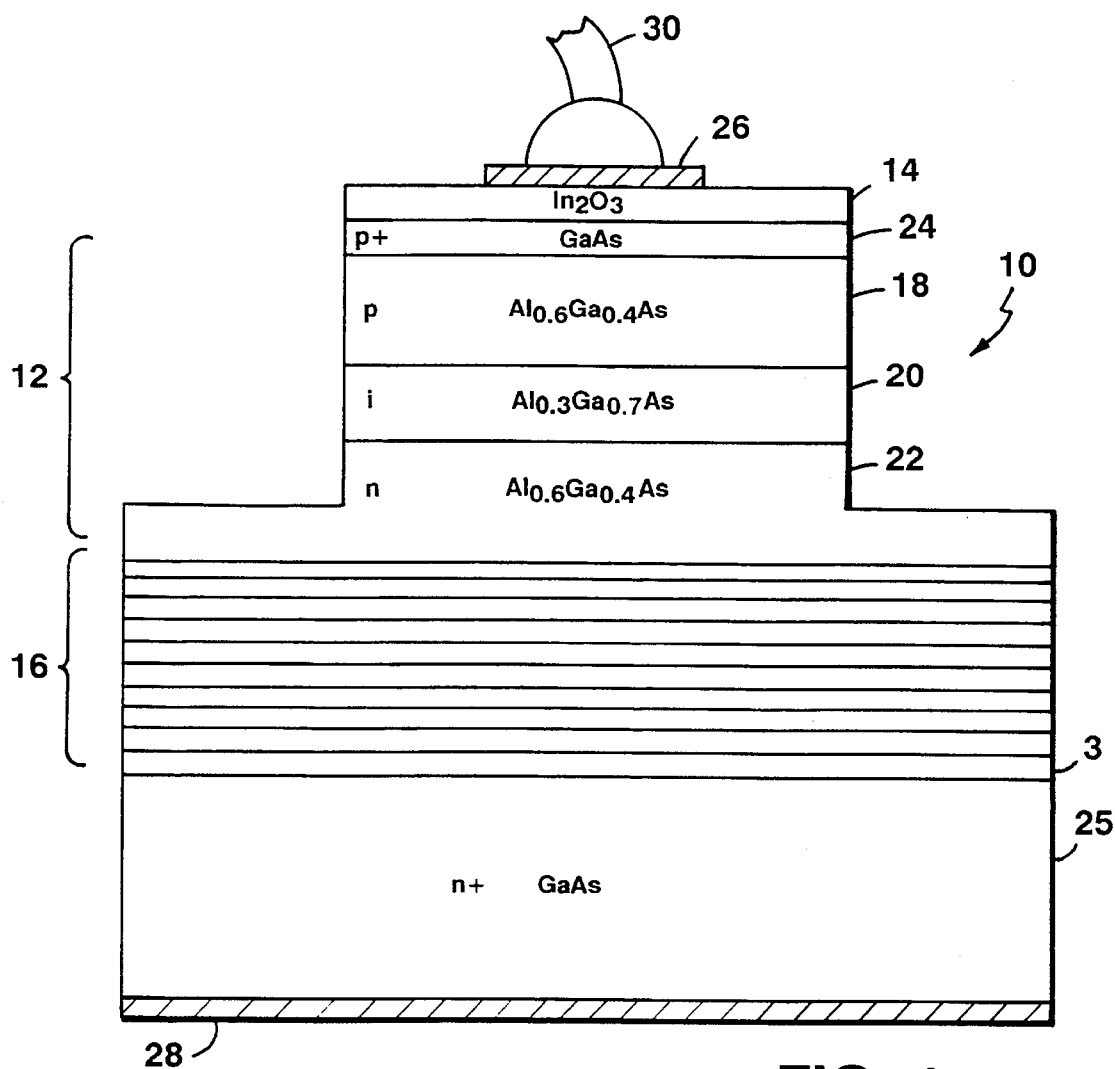
FIG. 1 is a section view of an LED with a DBR and an $In_2O_3$ current spreading layer.

The Structure:

Referring to FIG. 1, an LED structure 10 constructed in accordance with the invention includes a light emitting diode 12 with an indium rich, $In_2O_3$ current spreading layer 14 across its top-side and an indirect band-gap distributed Bragg reflector 16 on the bottom-side. Between the $In_2O_3$ current spreading layer and the top side of the light emitting diode 12 there is an interface region (or cap layer) 24 made of a heavily doped, low band gap material. Interface region 24 facilitates the electrical connection of the current spreading layer to the heterostructure device. By heavily doped, we mean a higher doping level than any of the layers of the light emitting device, and preferably the highest doping level of the structure. By low band gap we mean having a lower band gap than the active region of the light emitting device. In the described embodiment, interface region 24 is made of heavily doped p-type GaAs.

The entire structure is supported on an n-type GaAs substrate 25.

In the described embodiment, the light emitting diode is a p-i-n double heterostructure device with a lower band gap active region sandwiched between two wider band gap confining regions. More specifically, it includes a p-type upper confining layer 18, an i-type active region 20, and an n-type lower confining layer 22. The p-type layer 18 and the n-type layer 22 are made of $Al_xGa_{1-x}As$, where $x\approx0.6$; and the i-type (i.e, intrinsic) layer is made of $Al_xGa_{1-x}As$ layer, where $x\approx0.3$. The upper and lower confining layers 18 and 22 inject holes and electrons, respectively, into the active region, where they recombine to produce emitted light. A double heterostructure of this type emits red light when current is passed through it.

Note that the active region of the double heterostructure, rather than being i-type, can be lightly doped n-type or p-type. In addition, the light emitting device could simply be a p-n junction where the light is emitted from the junction region.

On the top-side of the structure, electrical contact is made to the device through a metal contact pad 26 that is deposited onto a portion of current spreading layer 14. On the bottom-side, electrical contact is made to the structure through a metal layer 28 that is deposited over the entire backside of the substrate.

$In_2O_3$ current spreading layer 14 has an optical transmittance $\geq 90\%$ over the entire visible spectrum. Thus, it makes a good window through which light can pass out of the device. In addition, it also has a relatively low electrical resistivity of $\sim 2\times10^{-4}$ $\Omega$cm thereby allowing the layer to be thin. $In_2O_3$ current spreading layer 14 spreads the current to portions of the heterostructure that are not obstructed by the metal contact pad. Thus, a larger proportion of the light that is generated within the device will leave the device.

Metal contact 26 on the top side is sized to be no larger than is necessary to permit a metal wire 30 to be easily bonded to it. That is, the metal pad is designed to obstruct as little of the $In_2O_3$ layer as is possible.

Fabrication of the Structure:

Starting with an $n^+$-type GaAs substrate, a 0.25 μm thick, Se-doped (e.g. $n_{Se}\sim 2\times10^{18}$ $cm^{-3}$), GaAs buffer layer 3 is deposited on top of the substrate in preparation for growing the DBR. Then, the DBR structure is grown on top of the GaAs buffer layer. The DBR has 20.5 periods, each period consisting of two layers (i.e., a AlAs layer and a $Al_xGa_{1-x}As$ layer) of equal thickness. In the described embodiment, x is greater than about 0.4 preferably up to at least about 0.8 if reflectivity of green light is desired. That is, both layers of each period of the DBR are made of indirect band gap semiconductor materials. Also, both layers are Se-doped (e.g. $n_{Se}\sim 2\times10^{18}$ $cm^{-3}$). Within the DBR, the first and the last layers are AlAs. Because the two layers have different indices of refraction (i.e., the larger band gap material having the smaller index of refraction), they produce a reflective interfaces. The stack of reflective layers when properly spaced, yields a relatively high reflectivity for the entire DBR.

The double heterostructure is deposited on top of the DBR. The lower layer of the double heterostructure is a 1 μm thick, Se-doped (e.g. $n_{Se}\sim 5\times10^{17}$ $cm^{-3}$) confining layer. The middle layer of the heterostructure is a 0.5 μm thick, undoped, $Al_{0.3}Ga_{0.7}As$ active region. And the upper layer of the heterostructure is a 1 μm thick, Mg-doped (e.g. $P_{Mg}\sim 5\times10^{17}$ $cm^{-3}$) $Al_{0.6}Ga_{0.4}As$ upper confining layer.

It should be noted that the drawings are not drawn to scale. The vertical dimensions are much exaggerated for purposes of illustrating the different junctions that are formed.

After the double heterostructure has been formed, a 0.1 μm thick, C-doped (e.g. $P_c\sim 8\times10^{18}$ $cm^{-3}$) GaAs cap layer is deposited on top. The cap layer improves the electrical characteristics of the interface between the $In_2O_3$ layer and the rest of the device, making it more ohmic in character.

Next a 0.2 μm thick indium rich, $In_2O_3$ layer is deposited on top of the cap layer by the reactive evaporation of an In-$In_2O_3$ mixture in an oxygen ambient. During the evaporation the substrate is heated to and maintained at a temperature of about 300° C.

The $In_2O_3$ layer is then patterned using $2H_2SO_4:3H_2O$ held at ~80° C. The patterning defines the size and shape of the pixel elements which will be produced. Next, a two-dimensional array of 250 μm diameter devices on 500 μm centers are constructed by wet-etching through the active region using a $1H_2SO_4:8H_2O_2:80H_2O$ solution and with the patterned $In_2O_3$ layer serving as an etch mask.

Finally, metal contacts 26 and 28 are produced by forming 100 μm diameter Ti/Au bond pads on top of the mesas and by alloying a Ni/Ge/Au composite onto the backside of the n+ GaAs substrate. To make good ohmic contacts between the deposited metal layer and the device an alloying step is performed during which the substrate is heated to about 400° C. in a rapid thermal anneal chamber for about 5–10 seconds.

All of the layers that are on top of the GaAs substrate up to the $In_2O_3$ layer can be grown using conventional processing techniques, for example, metalorganic chemical vapor deposition, molecular beam epitaxy, or liquid phase epitaxy. The process conditions for growing the layers in accordance with these different techniques are well know to those of ordinary skill in the art. Although the described embodiment was fabricated using metalorganic chemical vapor deposition, other techniques such as liquid phase epitaxy are know to produce better quality double heterostructures with higher internal quantum efficiencies.

The DBR is a quarter wave stack. The thickness of the layers making up the DBR is selected to achieve maximum reflectivity at the wavelength of interest and in a direction that is normal to the DBR. For the red light that is generated in the AlGaAs active region of the described embodiment, a layer thickness of about 500 Å is used. For shorter wavelengths, thinner layers would be appropriate.

The number of periods in the DBR determines the total reflectivity of the DBR. In general, the reflectivity increases as the number of periods increases. However, there is a point beyond which additional periods increase electrical resistivity but produce little improvement in reflectivity.

Using indirect band gap material for the DBR has several advantages. First, in the case of AlAs-$Al_xGa_{1-x}As$, by selecting x appropriately, one can produce a DBR that has a low absorption coefficient over most, if not all, of the visible spectrum. For example, if $x\geq 0.8$ the DBR will have a low absorption coefficient into the green region of the spectrum. Thus, by selecting an appropriate layer thickness, the DBR can be tailored to produce a highly reflecting surface for any specific wavelength (or color) within the visible spectrum. Second, using the indirect band gap materials actually reduces the series resistance of the DBR in comparison to using a combination of indirect band gap and direct band materials.

Other indirect band gap materials can be used for the fabrication of the DBR. For example, one could also use $(Al)_{0.5}In_{0.5}P-(Al_xGa_{1-x})_{0.5}In_{0.5}P$, where $x\geq 0.7$. Note, however, that this material produces a smaller differential in the index of refraction than does AlAs-$Al_xGa_{1-x}As$, which means that more periods would be required to achieve comparable levels of reflectivity.

It is important to make sure that all of the materials that are grown on the substrate are lattice matched to the substrate and to each other to avoid producing stresses that might induce dislocations, surface states or other undesirable effects that could degrade the electrical and optical performance of the devices. In the case of GaAs and AlAs, lattice mismatch is not a problem since they have substantially the same lattice constant. However, for other materials the composition must be carefully controlled. For example, with AlGaInP on a GaAs substrate, to achieve lattice matching the amount of AlGa must be approximately equal to the amount of In. That is, the composition should be: $(Al_xGa_{1-x})_{0.5}In_{0.5}P$.

As noted above, the use of an AlGaAs active region produces red light. Other semiconductor materials can be used to fabricate a light emitting region that produces other colors. The other semiconductor materials that can be used are well known to persons skilled in the art. For example, it is known that $(Al_xGa_{1-x})_{0.5}In_{0.5}P$ will produce a light having a color anywhere from red to green, depending on the relative proportions of Al and Ga.

Performance the Structure

Figure 2:
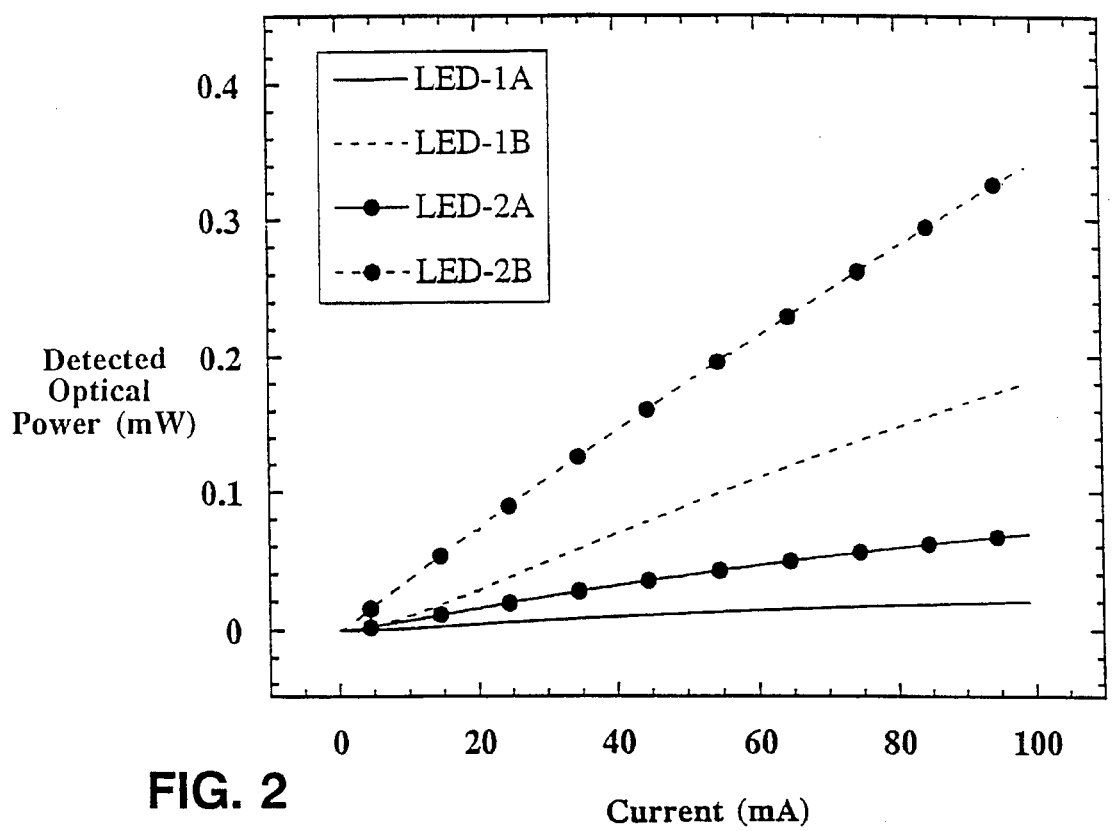
FIG. 2 compares light power versus bias current for four structures.

The performance of the above-described structure is shown in FIG. 2 on the curve labeled LED-2B. For comparison purposes, three other device structures were fabricated and their characteristics were also measured as shown by curves labeled LED-1A, LED-1B, and LED-2A. The LED-1A device is identical to the LED-2B device but without the $In_2O_3$ current spreading layer and without the DBR. The LED-1B device is identical to the LED-2B device but without the DBR. And, the LED-2A device is identical to the LED-2B device but without the $In_2O_3$ current spreading layer. The light power versus bias current (L-I) characteristics of FIG. 2 show that both the $In_2O_3$ current spreading layer (LED-1B) and the distributed Bragg reflector (LED-2A) significantly improve the performance of the device, the $In_2O_3$ more so than the DBR. And when both features are incorporated into the same structure (LED-2B), they cooperate to produce a significantly improved electron-to-photon conversion efficiency.

The measurements shown in FIG. 2 were performed by grounding the Ni/Ge/Au composite on the backside of the substrate to a copper heat sink, contacting the Ti/Au bond pad with a probe tip, and collecting the optical output via a silicon photodetector placed directly above the probe arm. A light detection efficiency of only 7%, was determined by reflecting a HeNe laser beam off a "white" surface at a shallow angle and measuring the light scattered perpendicular to the surface.

After correcting for optical losses, the electron-to-photon conversion efficiency is found to be in excess of 2% for LED-2B. It should be noted that this value is roughly 10 times smaller than that of commercially available "red" AlGaAs LEDs grown by liquid phase epitaxy. However, the data reported herein are for bare chips, not packaged lamps. In addition, the internal quantum efficiency of AlGaAs double heterostructures grown by metalorganic chemical vapor deposition is typically a factor of 2 to 10 times lower. In other words, if liquid phase epitaxy is used to fabricate the structures described herein and they are packaged appropriately, one would expect to see the overall electron-to-photon conversion efficiency to compare very favorably with commercially fabricated, conventional LEDs.

Figure 3:
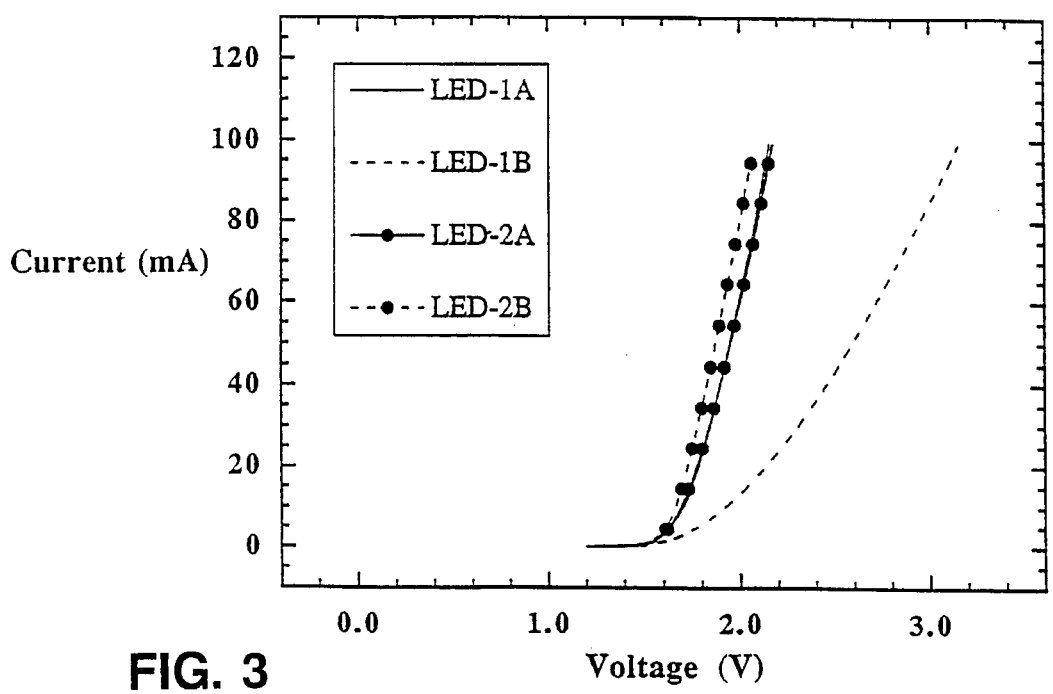
FIG. 3 presents plots of the current-voltage characteristics of the four structures shown in FIG. 2.

Previous work also suggests that the introduction of a thick, multi-heterojunction, semiconductor mirror may cause an unacceptable increase in LED series resistance. However, as indicated by FIG. 3 which plots the I-V characteristics of the various structures, the indirect band-gap, n-type DBR employed here (LED-2A) does not present a significant thermal emission barrier to electron flow. Indeed, the complete set of I-V characteristics demonstrate that both the $In_2O_3$ current spreading layer and the DBR can be incorporated into a structure without increasing the electrical power operating point (LED-2B).

Note that in the case of LED-1B the electrical properties of the $In_2O_3$-GaAs interface were not optimal. In this case, the current-voltage (I-V) characteristic reveals an increase in operating voltage from 1.8 to 2.3 V at 30 mA. Others have confirmed that this interface can be difficult to control, even though the bulk electrical and optical properties of the $In_2O_3$ layers are quite reproducible. Because of the poor electrical characteristics of LED-1B, a separate indium oxide deposition was performed for LED-2B. Independent measurements confirmed that devices with an $In_2O_3$ layer, but without the distributed Bragg reflector, also exhibit superior electrical characteristics.

Figure 4:
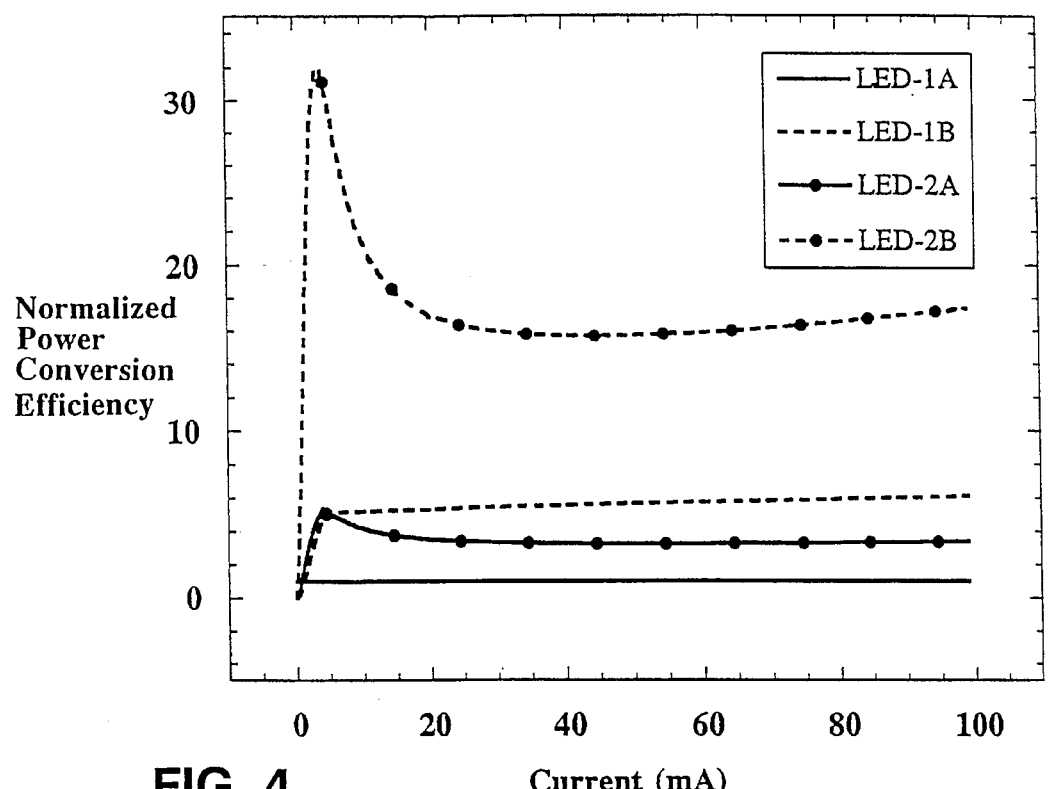
FIG. 4 presents electrical-to-optical power conversion efficiency data for the four structures shown in FIG. 2.

FIG. 4 is a plot of the electrical-to-optical power conversion efficiency data for the four structures. It shows that an increase in L-I slope efficiency can be fully exploited for devices with good I-V characteristics. For example, LED-2B exhibits a 15-fold increase in $\eta_p$ @ $I_{bias}$=30 mA. At a given value of $I_{bias}$, the current density for LED-1A is at least 5 time larger than for LED-2B due to inferior current spreading. Thus, it experiences a significantly larger increase in junction temperature and a much more dramatic decrease in internal quantum efficiency. This explains the monotonic increase in the normalized values of $\eta_p$ for LED-2B as $I_{bias}$ is raised above 30 mA. It is important to note that this trend is also observed for LED-1B, which is identical to LED-1A, except for the additional $In_2O_3$ current spreading layer.

Figure 5:
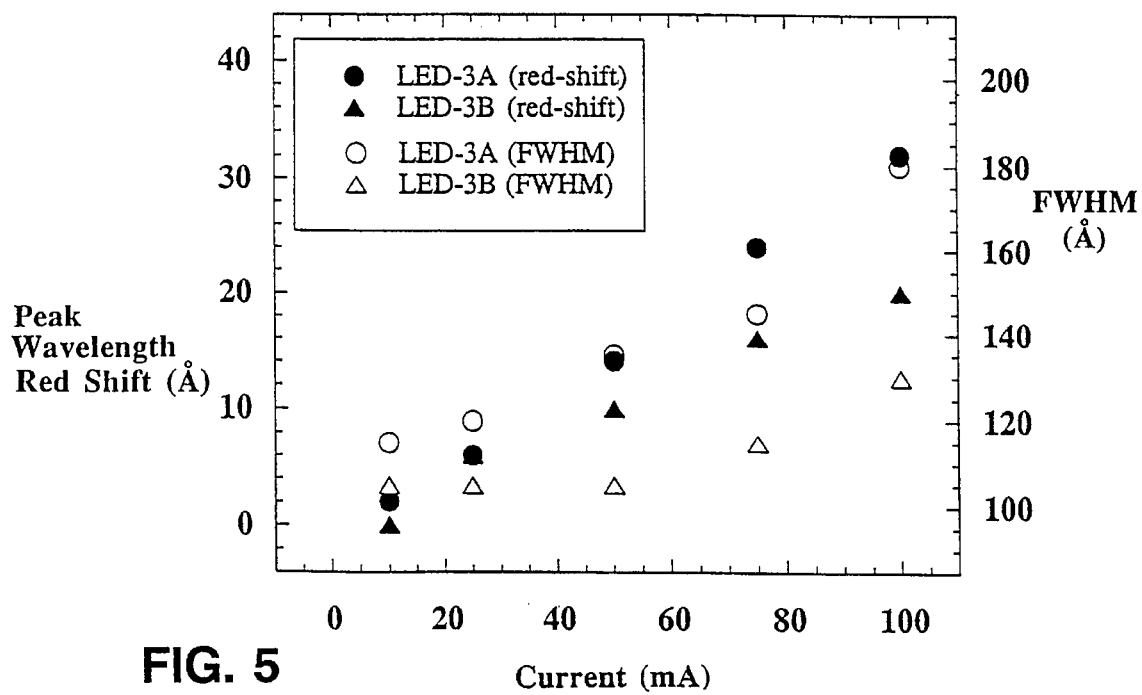
FIG. 5 presents electroluminescence data for the four structures shown in FIG. 4.

The hypothesis that LEDs with $In_2O_3$ benefit from reduced active region heating is confirmed by the electroluminescence data of FIG. 5. LED-3B, which is similar to LED-2B except that it has a more lightly doped GaAs cap layer ($P_{Mg}$~$2\times10^{18}$ cm$^{-3}$), exhibits less peak wavelength red-shift ($\Delta\lambda$) and less line width broadening (FWHM) at all current levels than does a corresponding device without $In_2O_3$ (LED-3A). For a more meaningful comparison, these two devices were biased so as to emit the same optical output power (~30 μW). Under these operating conditions, the appropriate values of $\Delta\lambda$ and FWHM are 1 and 105 Å, for LED-3B, as compared to 32 and 180 Å, for LED-3A.

In summary, the combination of a thin $In_2O_3$ current spreading layer and an indirect band-gap AlAs-$Al_{0.6}Ga_{0.4}As$ distributed Bragg reflector, enhances the electrical-to-optical power conversion efficiency of an AlGaAs LED by a factor of 15 @ λ~675 nm. Preliminary results from 450 μm square pixels indicate that $\eta_p$ is 25% greater than for the 50 μm diameter mesas reported here.

Figure 6:
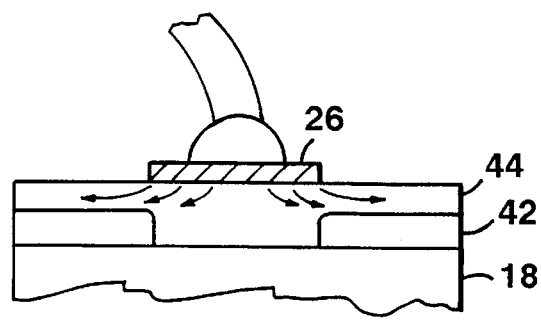
FIG. 6 shows an alternative layout of the cap layer.

To improve the light emitting efficiency of the device, the structure illustrated in FIG. 6 can be used. As described above, a p$^+$-type GaAs layer (i.e., cap layer) 42 serves as an interface between an $In_2O_3$ current spreading layer 44 and the upper confining layer 18 of the double heterostructure. Also, a metal contact pad 26 is deposited on top of the current spreading layer. In this case, however, the p$^+$-type GaAs cap layer 42 is not formed within the area that is directly below the metal contact pad 26. Thus, in these areas, the $In_2O_3$ current spreading layer 44 will not form a good electrical or ohmic contact with the underlying structure. During operation, this serves to spread the current away from the regions of the double heterostructure that are shadowed by the contact pad and into the regions that are covered only by the transparent $In_2O_3$ layer. Thus, the device will tend to not generate light in the regions that are directly beneath the contact pads, thereby increasing the efficiency of the devices.

An Integrated Array of LED's

An extension of these concepts to integrated arrays of light emitting devices is shown in FIGS. 7A and 7B.

The above described fabrication technique with some additional steps which will now be described make it possible to easily construct an integrated array of LED's on a single substrate. Referring to FIG. 7A, a DBR 102 and a double heterostructure 100 are deposited over the surface of a semiconductor substrate 104 (e.g. GaAs), as previously described. To form an array of light emitting pixels 106, a mask 110 is then formed on the surface of the substrate and patterned to define an array of pixels 106, leaving exposed regions 108 between the pixels. An array of individual light emitting devices is then formed from the large integrated structure by using an impurity-induced layer disordering technique to further diffuse the material in the layers located beneath the exposed regions 108 to produce layer-disordered isolation regions 120 between the individual pixels of the array (see FIG. 7B). The diffusion within the exposed regions eliminates the abrupt junctions that define the layers of the DBR and the double heterostructure, thereby rendering both the light emitting structure and the DBR substantially inoperative beneath the exposed regions 108. In this way, separate, isolated pixel elements are formed with individual isolated mirror regions beneath them.

After the layer disordering step has been performed, mask 110 is removed and a heavily doped, low band gap cap layer 112 is deposited onto the structure followed by a layer of $In_2O_3$. The $In_2O_3$ layer is then patterned to produce $In_2O_3$ current spreading islands 114 that are aligned and coincide with the light emitting regions of the individual pixels of the array.

By significantly reducing or eliminating the reflectivity of the DBR between pixels, the contrast separation between the light emitting elements within the array is increased. Light that impinges on the portions of the DBR in which layer disordering has been performed (i.e., the regions between pixels) tends to be absorbed by the substrate rather than reflected back up towards the surface of the structure. Thus, light that is emitted from one device will not be able to reflect over into a neighboring device to diminish the contrast ratio between those two pixels.

Impurity-induced layer disordering is an annealing process during which an impurity of a particular type (e.g. Si, Zn, etc.) is introduced into the wafer. The impurities are of a type which significantly enhance the diffusion coefficient in the regions into which they are introduced. As a result of the enhanced diffusion coefficient, the junctions which were previously formed in those regions are degraded by the further diffusion. The effect is to mix up the alloys so that abrupt junctions no longer exist and the layers become disordered.

Techniques for performing impurity-induced layer disordering are described in the literature and are known to persons skilled in the art. For example, refer to the following patents which describe such techniques: U.S. Pat. No. 4,639,275, issued Jan. 27, 1987, entitled "Forming Disordering Layer by Controlled Diffusion in Heterojunction III-V Semiconductor"; U.S. Pat. No. 4,511,408, issued Apr. 16, 1985, entitled "Semiconductor Device Fabrication with Disordering Elements Introduced into Active Region"; and U.S. Pat. No. 4,378,255, issued Mar. 29, 1983, entitled "Method for Producing Integrated Semiconductor Light Emitter".

Other embodiments are within the following claims.

What is claimed is:

1. An LED structure comprising:

a distributed Bragg reflector including multiple periods, each period comprising at least a first layer made of a first indirect band gap material and a second layer made of a second indirect band gap material, said first band gap material having a higher index of refraction than said second indirect band gap material;

a semiconductor light emitting diode formed on top of the distributed Bragg reflector, said light emitting diode having a top layer and a bottom layer, said bottom layer being proximate to said distributed Bragg reflector; and an isolation region extending from the top layer of light emitting diode down through the distributed Bragg reflector, said isolation region having an interior defining a light emitting pixel element, said isolation region formed by an impurity-induced layer disordering technique.

2. The LED structure of claim 1 wherein said second layer is made of $Al_xGa_{(1-x)}As$, where x is at least as great as 0.4.

3. The LED structure of claim 2 wherein x is at least as great as 0.6.

4. The LED structure of claim 3 wherein x is at least as great as 0.8.

5. The LED structure of claim 2 wherein said first layer is made of AlAs.

6. The LED structure of claim 1 wherein said second layer is made of $(Al_xGa_{1-x})_{0.5}In_{0.5}P$, where x is at least as great as 0.7.

7. The LED structure of claim 6 wherein said first layer is made of $Al_{0.5}In_{0.5}P$.

8. The LED structure of claim 1 wherein the light emitting diode is a double heterostructure light emitting device comprising a first confining layer, a second confining layer and an active region sandwiched between said first and second confining layers, wherein said top and bottom layers are said first and second confining layers, respectively.

9. The LED structure of claim 1 further comprising an $In_2O_3$ current spreading layer.

10. The LED structure of claim 9 further comprising a cap layer between the current spreading layer and the rest of said LED structure, said cap layer comprising a doped semiconductor material that functions to reduce electrical resistance between the current spreading layer and the rest of the LED structure.

11. The LED structure of claim 10 wherein the cap layer comprises $p^+$-type GaAs.

12. The LED structure of claim 11 wherein said cap layer has a p-type doping level that is greater than about $8 \times 10^{18}$ $cm^{-3}$.

13. An LED structure comprising:

a semiconductor light emitting diode having a top layer and a bottom layer and a light emitting region;

a cap layer above the light emitting diode, said cad layer being a p-type semiconductor material;

an $In_2O_3$ current spreading layer formed on top of the cap layer; and a metal contact pad formed on top of a portion of the $In_2O_3$ current spreading layer above the active region leaving an unobstructed portion of the $In_2O_3$ current spreading layer through which light generated in the light emitting active region passes out of the LED structure.

14. The LED structure of claim 13 wherein the light emitting diode is a double heterostructure light emitting device comprising a first confining layer, a second confining layer and an active region sandwiched between said first and second confining layers, wherein said top and bottom layers are said first and second confining layers, respectively.

15. The LED structure of claim 13 further comprising a distributed Bragg reflector formed below the bottom layer of said light emitting diode.

16. The LED structure of claim 15 wherein said distributed Bragg reflector includes multiple periods, each period comprising at least a first layer made of a first indirect band gap material and a second layer made of a second indirect band gap material, said first indirect band gap material having a higher index of refraction than said second indirect band gap material.

17. The LED structure of claim 16 wherein said second layer is made of $Al_xGa_{(1-x)}As$, where x is at least as great as 0.4.

18. The LED structure of claim 17 wherein x is at least as great as 0.6.

19. The LED structure of claim 18 wherein x is at least as great as 0.8.

20. The LED structure of claim 18 wherein said first layer is made of AlAs.

21. The LED structure of claim 16 wherein said second layer is made of $(Al_xGa_{1-x})_{0.5}In_{0.5}P$, where x is at least as great as 0.7.

22. The LED structure of claim 13 wherein said unobstructed portion has an area that is at least as large as 50% of the area of the light emitting region.

23. The LED structure of claim 13 wherein the cap layer comprises $p^+$-type GaAs.

24. The LED structure of claim 23 wherein said cap layer has a p-type doping level that is greater than about $8 \times 10^{18}$ $cm^{-3}$.

UNITED STATES PATENT AND TRADEMARK OFFICE
CERTIFICATE OF CORRECTION

PATENT NO. : 5,614,734

DATED : March 25, 1997

INVENTOR(S) : Louis J. Guido

It is certified that error appears in the above-identified patent and that said Letters Patent is hereby corrected as shown below:

On the title page, item [56]:

OTHER PUBLICATIONS; "Cook et al." reference, insert --Gallium-- after "Aluminum".

Col. 6, l. 48, "50" should be --250--.

Col. 8, l. 48, "cad" should be --cap--.

Signed and Sealed this

Twenty-third Day of March, 1999

Attest:

Q. TODD DICKINSON

Attesting Officer

Acting Commissioner of Patents and Trademarks